United States Patent [19]

Barry

[11] Patent Number: 5,014,086

[45] Date of Patent: May 7, 1991

[54] ADJUSTABLE DOT GAIN SIMULATION FOR COLOR PROOFING

[75] Inventor: Robert C. Barry, West Chester, Pa.

[73] Assignee: E. I. Du Pont de Nemours and Company, Wilmington, Del.

[21] Appl. No.: 331,994

[22] Filed: Mar. 31, 1989

[51] Int. Cl.[5] ............................................. G03B 27/72
[52] U.S. Cl. .......................................... 355/71; 355/77
[58] Field of Search ...................... 355/77, 67, 32, 35, 355/38, 71

[56] References Cited

U.S. PATENT DOCUMENTS

| | | | |
|---|---|---|---|
| 1,289,129 | 12/1918 | Douthitt | 355/77 |
| 1,563,499 | 12/1925 | Knudsen | 355/77 |
| 2,095,909 | 10/1937 | Bennett | 355/77 |
| 2,211,345 | 8/1940 | Murray | 355/77 |
| 2,304,988 | 12/1942 | Yule | 355/77 |
| 3,158,479 | 11/1964 | Pluess | 355/77 |
| 4,025,189 | 5/1977 | Pugsley | 355/38 |
| 4,229,097 | 10/1980 | Vulmiere et al. | 355/35 |
| 4,239,385 | 12/1980 | Hujer | 355/71 |
| 4,275,961 | 6/1981 | Fontana | 355/71 |
| 4,483,916 | 11/1984 | Thiers | 430/236 |
| 4,708,459 | 11/1987 | Cowan et al. | 355/4 |

Primary Examiner—Monroe H. Hayes
Attorney, Agent, or Firm—J. H. Dautremont

[57] ABSTRACT

The image dot gain that normally occurs in a printing press is controllably simulated as a separate step in the process of producing accurate color proofs. The simulation is attained by placing a diffuser plate between a high-intensity light source and a color-separated image master along with its corresponding image receptor. By varying the position of the diffuser plate the percentage of image dot gain is accurately controlled as an independent variable without the need to alter the exposure time.

12 Claims, 3 Drawing Sheets

ADJUSTABLE DOT GAIN SIMULATION FOR COLOR PROOFING

BACKGROUND OF THE INVENTION

1. Field of the Invention

This invention relates to color proofing, and more particularly to the production of color proofs that include independent simulation of the expected image dot gain of a color printing press.

2. Description of the Prior Art

Modern color printing of high-definition accurate-color pictures is accomplished by a four-step printing process comprising sequential application of standardized ink colors to a print medium in a uniform pattern location but with varying pattern size. FIG. 1(a) shows a typical grid containing colored dots of equal size thereon. On an actual printed picture the dots are present but the grid lines are not; the grid lines are shown only for the purpose of explanation. A multiplicity of equal-sized dot patterns as shown in FIG. 1(a) printed on a white page would produce a grey-looking region as viewed by the human eye. Therein, Y means yellow, B means black, M means magenta, and C means cyan. It is to be understood that the dots are very small in size, so as to be indistinguishable to the unaided human eye. Large regions of such sets of dots are integrated by the human eye into a continuous-looking image of some shade of grey depending on what percentage of the grid the equal-sized dots fill.

In order to obtain varying hues, as opposed to just varying shades of grey, the different-colored dots are varied in size with respect to each other as shown in FIG. 1(b). The grid section shown would produce a tiny region with a greenish look to the human eye. By combining many thousands of grid sections of varying dot sizes, a multi-colored print is produced in accordance with a desired pattern (i.e., a colored picture). The dot sizes and their relative magnitudes must be controlled very accurately, since a mere 2% variation in relative dot size can produce a humanly discernible change in color.

In standard practice, the colored picture printing process starts with the separation of a colored photographic image into four separate image maps containing appropriate variable weightings (i.e. dot sizes) of yellow, black, magenta, and cyan respectively.

Samples of small sectors of such maps are shown in FIGS. 2 (a–d); again, the grid lines are shown only for the purpose of explanation—they do not actually appear on the maps. These separate-colored image maps are referred to as "separations", the preparation of which has been standardized in the half-tone printing industry. Once the form separations have been made for a particular picture, they are used to generate four corresponding master printing plates by well-known optical exposure techniques. By observing close mechanical tolerances, the printing plates are then inked and sequentially applied to the same carefully-aligned print paper. The result is a high-quality multicolored print corresponding closely to the original photograph.

There are a variety of variables that must be controlled accurately in order to produce high-quality prints using the approach described above, e.g.: (1) "dot range" (i.e. the relative extremes of dot size); (2) the "solid density" (i.e. the color density of a solid patch); and (3) "dot gain" (i.e. the small increase in dot size from the original separations to the final print due to normal ink spreading during printing).

Before a printing run is done, it is usually desirable to produce a "proof" print from the four separations using photographic techniques. Since the object of a proof is to predict closely what the final prints will look like, it is necessary to simulate the dot gain phenomenon during the proof making process. The currently-used technique for simulating dot gain comprises exposing the proof photographic paper to the combined separation patterns for a longer-than-necessary time, thus causing the respective re-imaged dots to "bleed" outwardly to diameters somewhat larger than those of the original separation. Unfortunately, exposure time has a markedly nonlinear effect on photographic receptors with regard to various factors such as image development process grain size, color density (i.e., color shade), and even to some degree color hue. Thus, increasing exposure time to obtain the desired dot gain simulation can adversely affect other factors that impact the clarity and fidelity of the resulting proof photograph. Some compromise of proof quality must therefore be accepted using currently-known techniques.

It is therefore an object of the instant invention to provide a method and apparatus for simulating dot gain during the process of making photographic proofs without unnecessarily altering the photographic exposure time of the proof film.

In the related art, U.S. Pat. No. 4,708,459, issued to Cowan et al. on Nov. 24, 1987, discloses at Column 12, line 29 through column 15, line 15, known techniques for accomplishing some control over dot gain, including exposure control, working voltage control, and use of a transparent spacer, but the independent dot gain control technique of the instant invention is not shown or suggested.

U.S. Pat. No. 4,229,097 issued to H. N. Vulmiere et al. on Oct. 21, 1980, describes a system for creating enlarged half-tone or continuous-tone negatives for four-color printing. This system, as summarized at column 2, line 26 through column 3, line 26, utilizes various individual lenses, a condensor, an auxiliary light source, frosted discs, and other apparatus in combination. Nowhere therein is there disclosed or suggested the apparatus or method of the instant invention.

U.S Pat. No. 4,239,385, issued to Hujer on Dec. 16, 1980, discloses, at column 3, line 28 through column 4, line 56, an optical system for controlling exposure employing a liquid crystal element array. The instant invention is not shown or suggested therein.

U.S. Pat. No. 4,025,189 issued to Pugsley on May 24, 1977, discloses apparatus to control the intensity of light used for reproducing half-tone images. This system, as detailed at column 5, lines 1 through 60, employs a PLZT modulator placed between crossed polarizers for the purpose of controlling light transmission. The instant invention is not disclosed or suggested therein.

SUMMARY OF THE INVENTION

The standard approach for exposing a photographic proof sheet with the image of a separation original has been as depicted in FIG. 3. Light passes from a substantially point source 31 (a small printing lamp about one inch in diameter) through an aperture 32 and on through the separation original 33 onto a photosensitive receptor 34.

While experimenting with standard apparatus, applicant has discovered a method and apparatus for controlling dot gain that is independent of exposure time. This allows separate optimization of both exposure energy and dot gain simulation. The technique of the invention comprises placing a light-diffusing plate between the light source and the separation master. This causes the substantially point source to produce a more diffused light, comparable to that produced by a much larger disc-shaped source. The effective size of this diffused light source can be adjusted by moving the diffuser plate vertically along the center line of the cone of light resulting from the light source and the aperture. For a given exposure time, the effective dot gain varies with the vertical distance from the aperture to the light diffusing plate (i.e. the dot gain varies with the size of the "apparent source" imaged at the diffuser plate). In one preferred embodiment the light-diffusing plate positioning apparatus is motorized so as to be quickly selectably adjustable.

Using this approach, applicant has obtained controlled variations in exposure-independent values of simulated dot gain in the desired amounts of four percent to twenty-five percent.

DETAILED DESCRIPTION

Figure 1A:
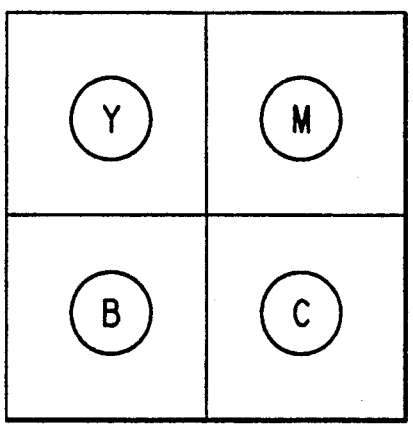
FIG. 1(a) shows an enlargement of a uniform-sized colored dot pattern.
Figure 1B:
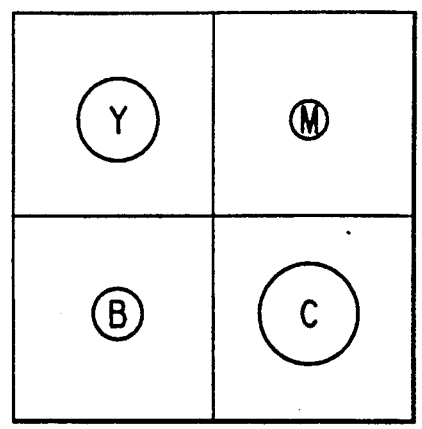
FIG. 1(b) depicts an enlargement of an arbitrary-sized colored dot pattern.
Figure 2A:
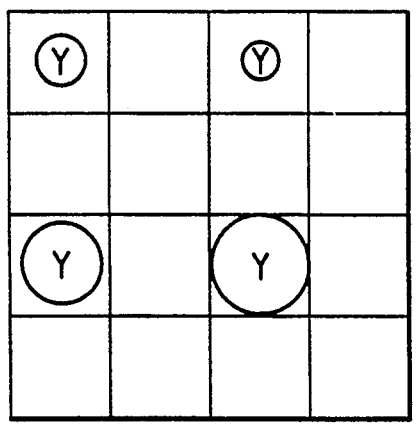
FIGS. 2 (a-d) show enlargements of a set of colored dot patterns of four standard colors used to form a small portion of a colored image.
Figure 2B:
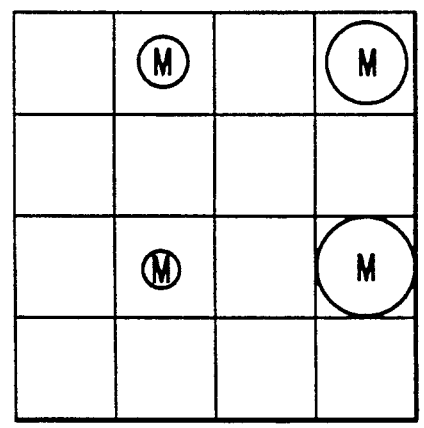
Figure 2C:
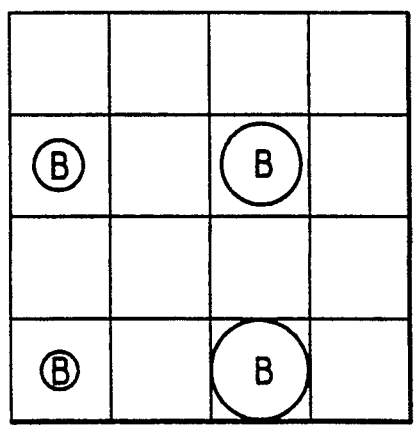
Figure 2D:
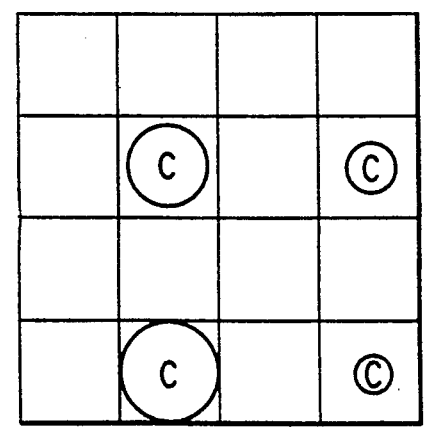
Figure 3:
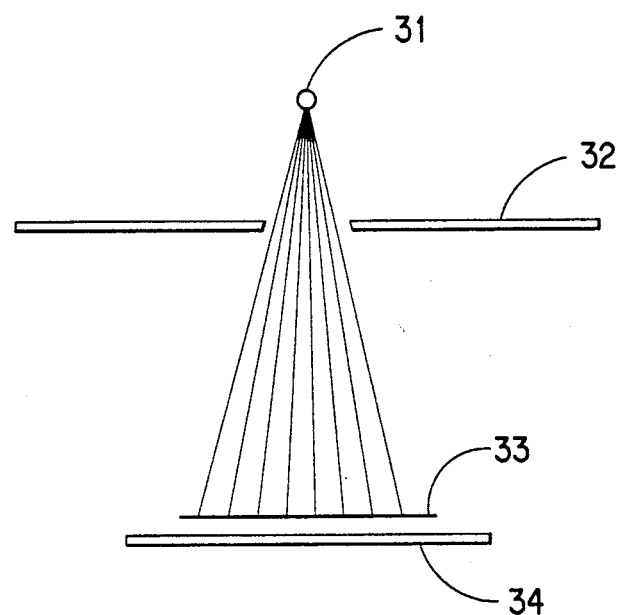
FIG. 3 shows the proof-exposing apparatus of the prior art.
Figure 4:
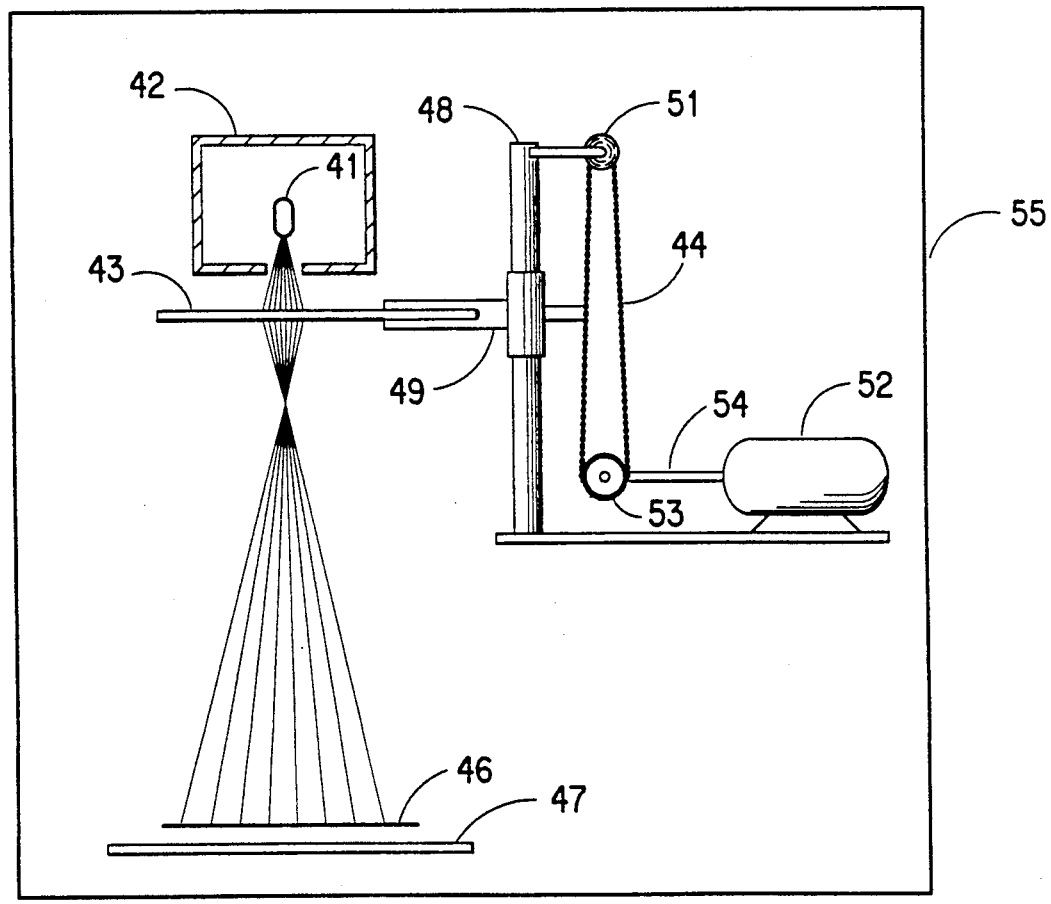
FIG. 4 depicts the independent dot gain adjustment apparatus of the instant invention.

A preferred embodiment of applicant's invention is depicted in FIG. 4. Therein, high-intensity microwave-energized light source 41 is a plasma-filled glass bulb commercially available from Fusion Systems Corp. of Rockville, Maryland, U.S.A. Light from enclosed source 41 emanates through the hole in aperture plate 42 and then through optical diffuser plate 43 before passing through color separation master pattern 46 and onto photosensitive proof film 47. The optical diffuser plate 43 used by applicant was obtained from the U.S. company, Spindler and Hoyer Corporation. It has a moderate light diffusion factor although a broad range of diffusion factors would be acceptable for use with the invention. A lambertian diffuser is also usable.

Diffuser plate 43 is gripped by sliding clamp 49 which is mounted around guide post 48. Sliding clamp 49 is connected to drive chain loop 44 which rides on pulley 51. Pulley 51 is attached to the top of guidepost 48. Chain loop 44 is driven by sprocket 53 which is connected to the shaft 54 of drive motor 52. By controlling drive motor 52 with a standard position control system, diffuser plate 43 may be moved up and down perpendicular to the optical axis, of the cone of light created by light source 41 and the hole in aperture plate 42.

The effect of moving the diffuser plate 43 further away from the light source 41 is to cause the light source to appear to increase in size. This "reimaging" has a marked effect on the degree of collimation of the light that eventually strikes the color separation master 46 and the photosensitive proofing film 47. Depending on the degree of collimation of the light, the opaque areas of the color separation master 46 are undercut by the resulting penumbra to varying degrees. An increased undercut, which simulates increased printing dot gain, is achieved by more diffuse light which in turn is created when the diffuser plate is moved further away from the aperture plate 42. Use of this apparatus all within a black-lined light box 55 allows an operator to achieve a relatively broad range of simulated printing dot gain levels on the photosensitive proof film 47 without having to alter the exposure time setting forth that which is otherwise optimum for other process parameters which affect picture clarity and color fidelity. Alternatively, multiple light sources could be used at various adjacent locations to simulate a smaller or larger effective light source. Also, the aperture plate 42 could vary in diameter or in distance from the light source to help simulate a larger or smaller effective source.

Figure 5:
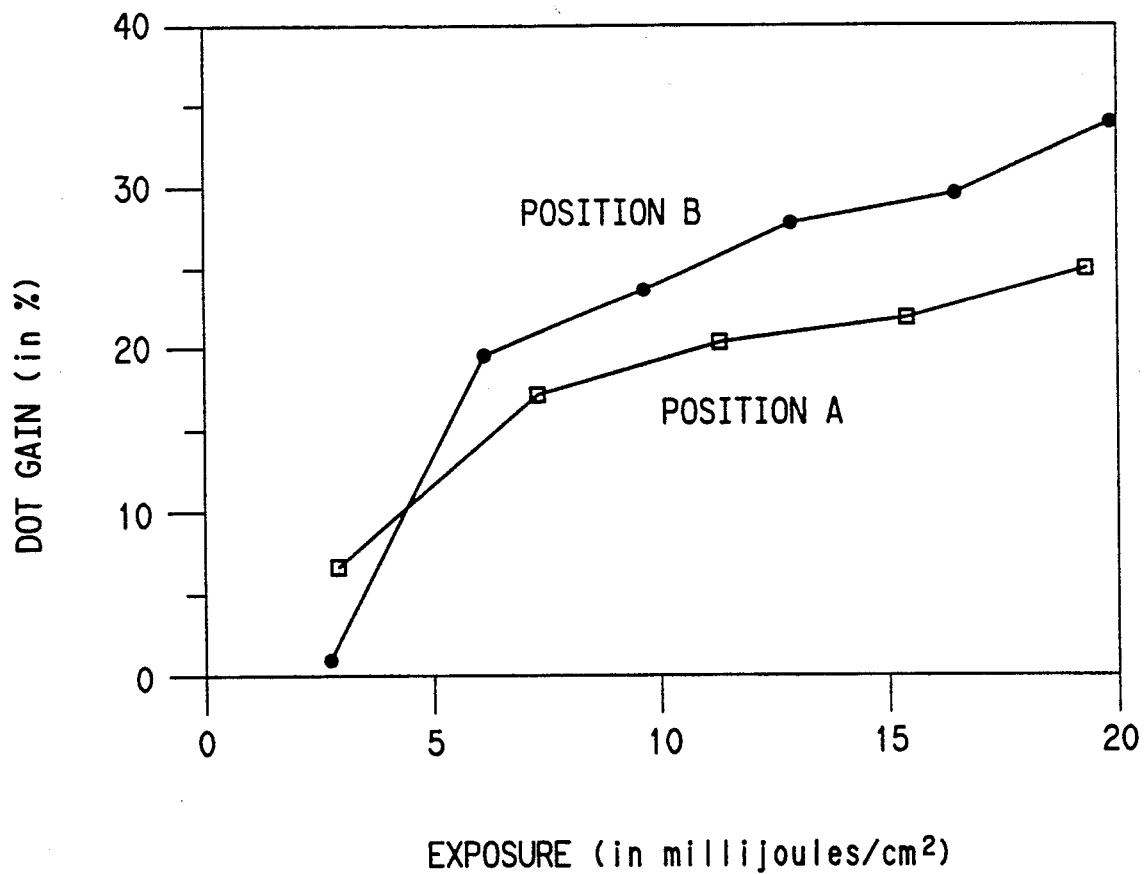
FIG. 5 shows a graph of actual laboratory data verifying how dot gain can be varied in accordance with the instant invention.

FIG. 5 depicts actual laboratory data, taken by the Applicant, which verifies the utility of the instant invention. The graph shows that for a given practical exposure levels (i.e. 5 millijoules/cm$^2$ and above), placement of the diffuser plate 43 at a position further away from the light source causes a significant increase in the resulting dot gain (e.g. about 4% at an exposure level of 10 millijoules/cm$^2$).

The method and apparatus described above portray a specific system considered as preferred by applicant; nonetheless, many modifications thereto and variations thereof may be envisioned by one skilled in the art to which this invention pertains without departing from the scope and coverage of the appended claims.

What is claimed is:

1. In a system for controlling dot gain during exposure of a proof film, including a light source, an aperture plate through which a cone of said light is light, and said proof film placed adjacently parallel to said master pattern so that said cone of light passes through non-opaque sections of said master pattern onto said proof of film, wherein the improvement comprises:
    diffuser means placed in said cone of light between said aperture and said master pattern for altering the degree of collimation of the light striking said master pattern by changing the apparent size of said light source.

2. The improved proof film exposing system of claim 1, wherein said system includes means for positioning said diffuser means at various locations along the optical axis of said cone of light and perpendicular to said axis.

3. The improved proof film system of claim 1 wherein said system is contained within a container for shielding said system from ambient light.

4. The improved proof film system of claim 2 wherein said system is contained within a container for shielding said system from ambient light.

5. A method of controlling dot gain during exposure of a proof film, including the steps of:
    (a) positioning a light source to allow a cone of light to pass through an aperture in an aperture plate;
    (b) placing a diffuser within said cone of light to modify the effective size of said light source; and
    (c) allowing the resulting diffused light to pass through non-opaque portions of a master pattern onto said proof film.

6. The method of claim 5 including the step of adjusting the position of said cone to obtain a desired degree of collimation of said beam of light.

7. In a system for controlling dot gain during exposure of a proof film, including a light source, an aperture plate through which a cone of said light is allowed to pass, a master pattern positioned in said beam of light, the proof film placed adjacently parallel to the master pattern so that the beam of light passes through non-opaque sections of said master pattern onto said proof film, wherein the improvement comprises:

diffuser means placed between said aperture plate and said master pattern and means for positioning said diffuser means at various locations along the optical axis of said beam of light and perpendicular to said axis for varying the effective size of said light source and thus varying the degree of collimation of the light striking said master pattern.

8. An apparatus for controlling dot gain during exposure of half-tone images, including:

a first light source an aperture plate through which light from said light source is allowed to pass, thus creating a cone of light, a master pattern having opaque sections thereon positioned in said cone of light a photosensitive receptor placed adjacently parallel to said master pattern so that said cone of light passes through non-opaque sections of said master pattern on said photosensitive receptor, wherein the improvement comprises:

a diffuser plate in the path, interpiped between said master pattern and said aperture plate, means to image said cone of light on said diffuser plate to generate a second, effective light source, and means to vary the size of the effective light source whereby to alter the effective collimation of the light beam incident on the photosensitive receptor.

9. An apparatus in accordance with claim 8 wherein said means to vary the size of said effective light source comprise means to alter the distance between said aperture plate and said diffuser plate.

10. An apparatus in accordance with claim 9 wherein said diffuser plate is a lambertian diffuser.

11. A method of controlling dot gain during the exposure of a proof film, including the steps of:

(a) positioning a light source to allow a cone of light to pass through an aperture in an aperture plate;

(b) placing a diffuser within said cone of light after it has passed through said aperture;

(c) adjusting the position of said diffuser along said cone of light to vary the effective size of said light source and thus to obtain a desired degree of collimation of said cone of light;

(d) allowing the resulting light to pass through non-opaque portions of a master pattern and impinge onto said proof film.

12. A method of controlling dot gain during the exposure of a proof film comprising varying the effective source size of a light source used to cause said exposure, the invention comprising the following steps:

(a) placing an aperture plate between said light source and said proof film, thus creating a cone of light in the direction of said proof film, (b) placing a light diffuser within said cone of light between said aperture plate and said proof film, and (c) adjusting the position of said light diffuser from said aperture plate so as to obtain a desired effective light source size.

* * * * *